United States Patent
Krishnamoorthy et al.

(10) Patent No.: US 7,592,707 B2
(45) Date of Patent: Sep. 22, 2009

(54) METHOD AND APPARATUS FOR FACILITATING PROXIMITY COMMUNICATION AND POWER DELIVERY

(75) Inventors: Ashok V. Krishnamoorthy, San Diego, CA (US); John E. Cunningham, San Diego, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 338 days.

(21) Appl. No.: 11/385,445

(22) Filed: Mar. 20, 2006

(65) Prior Publication Data

US 2007/0075442 A1 Apr. 5, 2007

Related U.S. Application Data

(63) Continuation-in-part of application No. 11/243,300, filed on Oct. 3, 2005.

(51) Int. Cl.
*H01L 23/48* (2006.01)
*H01L 23/52* (2006.01)

(52) U.S. Cl. .................. 257/777; 257/685; 257/686; 257/778; 257/E21.508; 257/E25.013; 438/107; 438/108; 438/109

(58) Field of Classification Search .......... 257/685, 257/686, 777, 778; 438/108
See application file for complete search history.

(56) References Cited

U.S. PATENT DOCUMENTS 5,319,725 A * 6/1994 Buchmann et al. .......... 385/14
6,500,696 B2 12/2002 Sutherland ................ 438/109
6,555,917 B1 * 4/2003 Heo ......................... 257/777

OTHER PUBLICATIONS

R.J. Drost, R.D. Hopkins, and I.E. Sutherland, "Proximity communications," Proc. IEEE Custom Integrated Circuits Conference (CICC-2003), pp. 469-472, Sep. 2003.

* cited by examiner

*Primary Examiner*—Dao H Nguyen
(74) *Attorney, Agent, or Firm*—Park, Vaughan & Fleming LLP

(57) ABSTRACT

One embodiment of the present invention provides a system that facilitates precise inter-chip alignment for proximity communication and power delivery. The system includes a first integrated circuit chip, whose surface has etch pit wells. The system also includes a second integrated circuit chip, whose surface has corresponding etch pit wells configured to align with the etch pit wells of the first integrated circuit chip. A shaped structure is placed in an etch pit well of the first integrated circuit chip such that when the corresponding etch pit well of the second integrated circuit chip is substantially aligned with the etch pit well of the first integrated circuit chip, the shaped structure mates with both the etch pit well of the first integrated circuit chip and with the corresponding etch pit well of the second integrated circuit chip, thereby precisely aligning the first integrated circuit chip with the second integrated circuit chip. Besides aiding in alignment, the shaped structure also creates a conductive connection between the first integrated circuit chip and the second integrated circuit chip.

13 Claims, 3 Drawing Sheets

METHOD AND APPARATUS FOR FACILITATING PROXIMITY COMMUNICATION AND POWER DELIVERY

RELATED APPLICATION

This application is a continuation-in-part of pending U.S. patent application Ser. No. 11/243,300 filed on 3 Oct. 2005 by inventors Ashok V. Krishnamoorthy, John E. Cunningham, and Edward L. Follmer, entitled "Method and Apparatus for Precisely Aligning Integrated Circuit Chips". This application hereby claims priority under 35 U.S.C. §120 to the above-listed parent patent application.

GOVERNMENT LICENSE RIGHTS

This invention was made with United States Government support under Contract No. NBCH3039002 awarded by the Defense Advanced Research Projects Administration. The United States Government has certain rights in the invention.

BACKGROUND

1. Field of the Invention

The present invention relates generally to techniques for assembling systems containing integrated circuit chips or wafers. More specifically, the present invention relates to a method and an apparatus for precisely assembling systems containing semiconductor chips to facilitate proximity communication and power delivery between the semiconductor chips.

2. Related Art

Conductive electrical interconnections and transceivers are generally used to provide reliable communications between integrated circuit (IC) chips in computer systems, due to their packaging and manufacturing advantages. However, decreasing semiconductor line-widths and increasing on-chip clock speeds are putting pressure on the ability of traditional resistive wires to achieve the off-chip bandwidths necessary to fully utilize on-chip computational resources.

A new technique referred to as "proximity communication" overcomes the limitations of conductive connections by using capacitive coupling to provide communications between chips which are oriented face-to-face. This capacitive coupling can provide signal densities two orders of magnitude denser than traditional off-chip communication using wire-bonding or traditional ball-bonding, while the circuits and coupling structures remain fully-compatible with standard CMOS foundries. To communicate off-chip through capacitive coupling, on-chip circuits drive high-impedance, capacitive transmitter pads. Such communication avoids impedance conversion and thereby reduces the power normally dissipated by off-chip driver circuits. Moreover, simple driver circuits and small chip-to-chip distances can significantly reduce the total chip-to-chip communication latency.

While proximity communication provides off-chip signaling bandwidth that scales with chip feature size, it also introduces topological constraints. The active sides of chips typically need to face each other with full or partial overlap, so that corresponding transmitter and receiver pads on opposing chips align both laterally and vertically. Achieving and maintaining chip alignment for proximity communication is challenging, especially when combined with other constraints such as conductive connections for other signals such as power and ground.

Hence, what is needed is a method and an apparatus that facilitates proximity communication and power delivery without the limitations of existing approaches.

SUMMARY

One embodiment of the present invention provides a system that facilitates precise inter-chip alignment for proximity communication and power delivery. The system includes a first integrated circuit chip, whose surface has etch pit wells. The system also includes a second integrated circuit chip, whose surface has corresponding etch pit wells configured to align with the etch pit wells of the first integrated circuit chip. A shaped structure is placed in an etch pit well of the first integrated circuit chip such that when the corresponding etch pit well of the second integrated circuit chip is substantially aligned with the etch pit well of the first integrated circuit chip, the shaped structure mates with both the etch pit well of the first integrated circuit chip and with the corresponding etch pit well of the second integrated circuit chip, thereby precisely aligning the first integrated circuit chip with the second integrated circuit chip. Besides aiding in alignment, the shaped structure also creates a conductive connection between the first integrated circuit chip and the second integrated circuit chip.

In a variation on this embodiment, the etch pit well includes conductive material that conducts signals to and from other regions of the integrated circuit chip. This conductive material allows a signal, such as power or ground, to be conducted between the first integrated circuit chip and the second integrated circuit chip through the shaped structure.

In a further variation, the shaped structure can be formed in a variety of different shapes that include: a substantially spherical ball; a truncated sphere; a prism; a hexagon; and/or a pyramid.

In a further variation, the system includes multiple shaped structures with different sizes. These multiple shaped structures can conduct different signals or a smaller set of signals with fault tolerance and/or higher current capacity.

In a variation on this embodiment, the shaped structure is comprised of either a conductive material or a non-conductive material with a conductive coating.

In a variation on this embodiment, the system uses compressive forces to align the first integrated circuit chip, the shaped structure, and the second integrated circuit chip. Compliance in the shaped structure and/or the etch pit wells facilitates surface contact between the shaped structure and the sidewalls or bottom of the etch pit wells.

In a variation on this embodiment, the shaped structure is bonded to the first integrated circuit to create a male-female connector interface.

In a variation on this embodiment, the shaped structure provides a connection that can be disconnected and reconnected easily.

In a further variation, a conductive material that reduces contact resistance is placed inside the etch pit well to increase surface contact area and reduce electrical resistance. This conductive material can include a conductive low-viscosity paste or liquid.

In a variation on this embodiment, the etch pit well and the shaped structure are formed using: an additive process; a subtractive process; or both an additive and subtractive process.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the claims.

The data structures and code described in this detailed description are typically stored on a computer-readable storage medium, which may be any device or medium that can store code and/or data for use by a computer system. This includes, but is not limited to, magnetic and optical storage devices such as disk drives, magnetic tape, CDs (compact discs), DVDs (digital versatile discs or digital video discs), or any device capable of storing data usable by a computer system.

Proximity Communication

Figure 1:
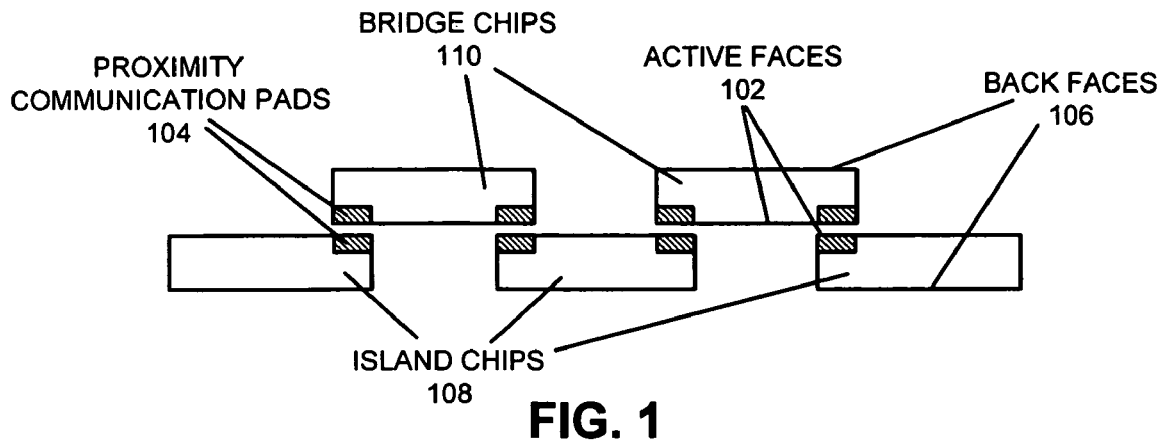
FIG. 1 illustrates an array of chips communicating using proximity communication in accordance with an embodiment of the present invention.

Proximity communication overcomes the limitations of resistive wires by communicating through capacitive coupling between chips that are placed face-to-face. As shown in FIG. 1, for an array of chips communicating through proximity communication, the active faces 102 of the chips typically face each other with full or partial overlap, with the corresponding proximity communication pads 104 on opposing chips aligned both laterally and vertically. The back faces 106 of chips are also labeled for clarity.

Figure 2:
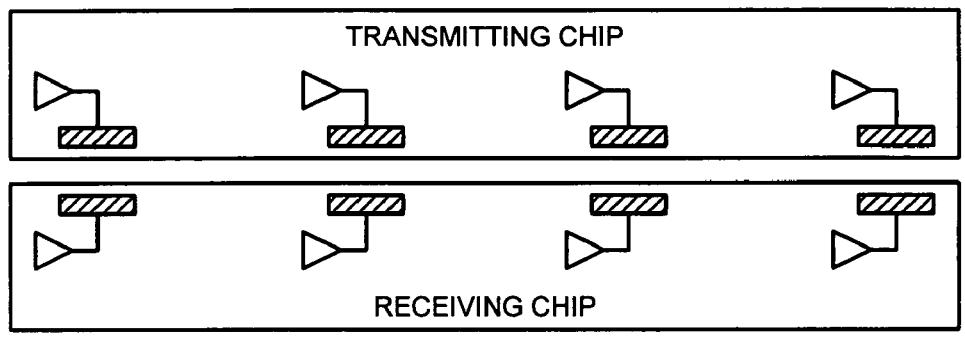
FIG. 2 illustrates aligned receiver pads overlapping with transmitter pads.
Figure 3:
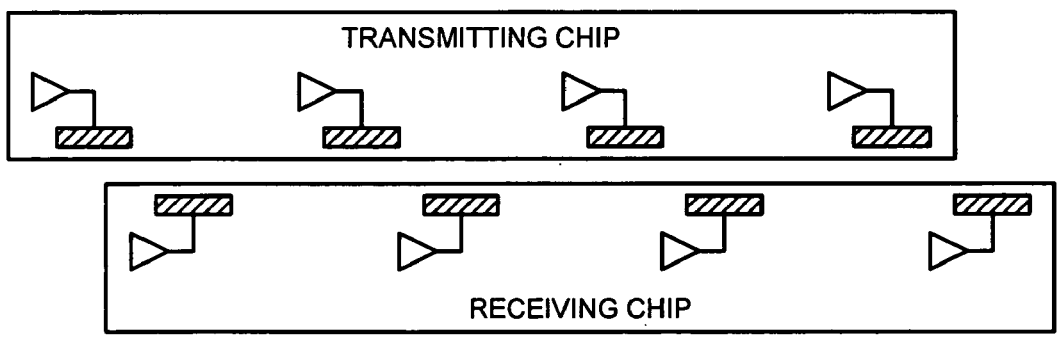
FIG. 3 illustrates misaligned receiver pads overlapping with transmitter pads.

Proximity communication provides off-chip signaling bandwidth that can scale with the feature size and with the on-chip frequency. However, precise alignment constraints need to be satisfied for proximity communication to operate effectively. FIG. 3 illustrates a top-view of two integrated circuit chips where the receiver pads on one integrated circuit chip are misaligned with the transmitter pads on the other integrated circuit chip. To effectively leverage the enormous bandwidth available through proximity communication, two chips need to be brought together and precisely aligned both laterally as well as axially (e.g. in the z-direction), so that the receiver pads align with the transmitter pads as illustrated in FIG. 2. The mechanical alignment mechanism needs to be reliable, manufacturable and cost-effective, and able to maintain alignment between the chips across six degrees of freedom.

Alignment Using Silicon Etch Pits

In one embodiment of the present invention, silicon etch pits are micromachined into silicon integrated circuit chips. These micromachined structures can be formed photolithographically in sequence before, during, or after circuit fabrication, which allows the etch pits to be photolithographically defined in relationship to the circuits. This photolithographic alignment between the etch pits and circuits enables the top and bottom circuits to be precisely aligned with each other.

Figure 4:
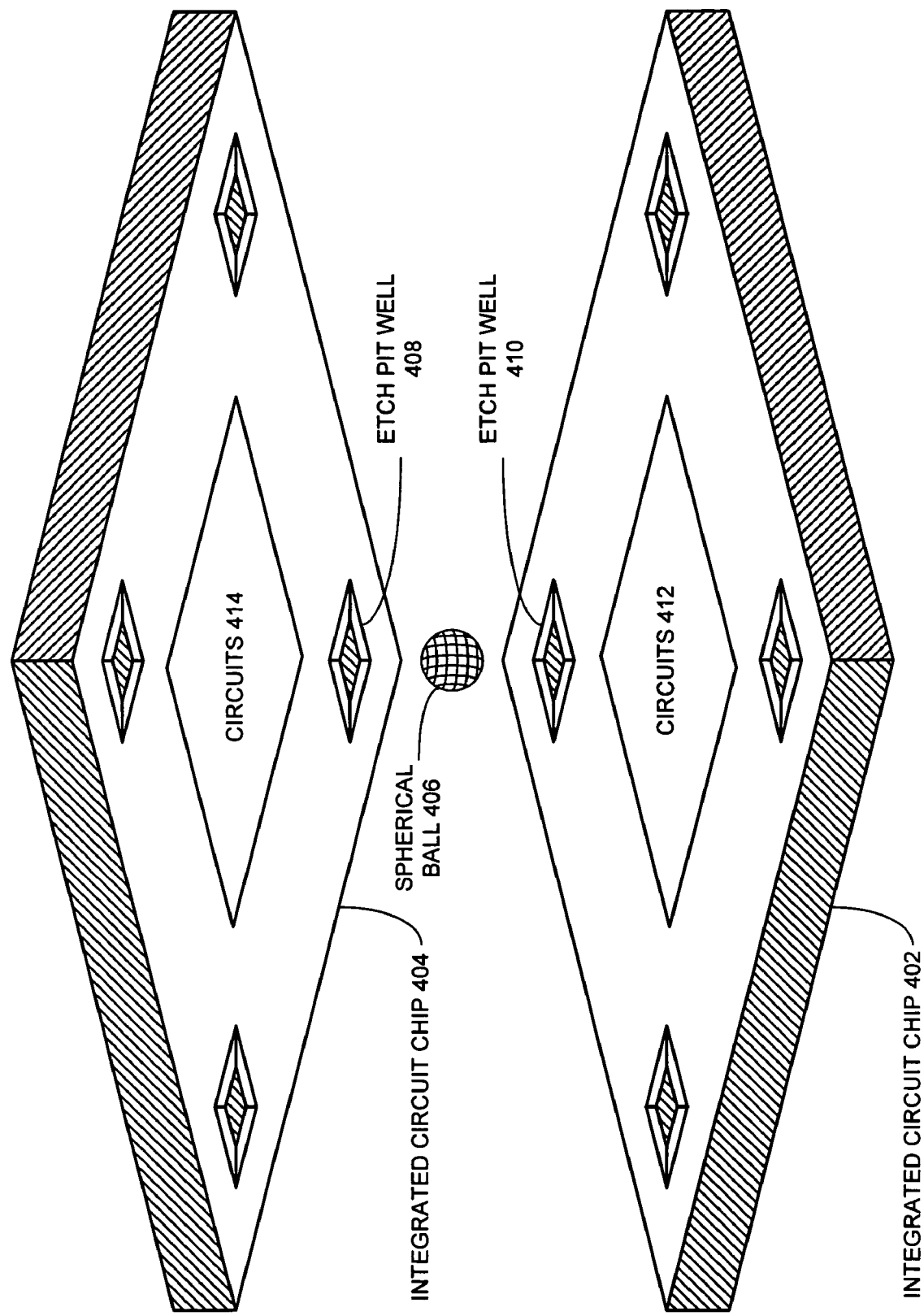
FIG. 4 illustrates two integrated circuit chips which are positioned face-to-face and aligned using etch pit wells in accordance with an embodiment of the present invention.

FIG. 4 illustrates two integrated circuit chips (402 and 404) which are positioned face-to-face and aligned using etch pit wells (408 and 410) fabricated in the corners of each chip and a set of shaped structures, in this case spherical balls 406, that fit in the etch pits for alignment purposes. The spherical balls are inserted into the etch pit wells of the bottom chip before the positioning step. The two chips are then first coarsely aligned mechanically. After the course alignment, a precise alignment process begins in which the balls eventually co-locate the two chips as the balls settle into the etch pits in each corner of the chips. At equilibrium, assuming that the spherical balls are sufficiently large to fit in the etched pit wells, the balls sit in the etch pit wells such that their equators lie higher than the chip surfaces, and the top and the bottom circuits (414 and 412) align precisely.

FIG. 4 illustrates a situation where both the top and bottom chips have full overlap. In another embodiment of the present invention, the top and bottom chips only overlap partially, but are still coupled and aligned with respect to each other using a substantially similar technique. The depth and shape of the etch pit wells, as well as the shape and size of the shaped structures, can be finely tuned to optimize the separation between the two chips for proximity communication purposes.

Alignment Using Conductive Structures

Two precisely-aligned integrated circuit chips can send data signals to each other using proximity communication. However, transferring power and ground signals to both chips typically requires a conductive channel.

In one embodiment of the present invention, the lower chips in FIG. 1 are referred to as "island chips" 108, and the upper chips are referred to as "bridge chips" 110. In such an arrangement, power and ground can be externally provided to the island chips 108, while the bridge chips 110 have less active circuitry and power consumption and serve primarily to couple two or more island chips together. However, an even more advantageous and flexible configuration includes a way for the island chips to also provide power and ground to the bridge chips.

One embodiment of the present invention extends the technique for face-to-face alignment of integrated circuit chips to use the same shaped structures that provide alignment to also conduct power and ground signals. These shaped structures provide a connector that is precision-aligned both laterally and in relative height, and can be disconnected and reconnected. The ability to disconnect and re-mate the shaped structure is an important improvement; while many structures can be collapsed under pressure to provide a good conductive contact, such structures are not rematable.

The alignment structures placed in the etch pit wells can be comprised of conductive materials, or can also be comprised of some other material, such as glass or sapphire, with a conductive coating. Note that it may be necessary to metallize the etch pit wells so that the corresponding power and ground signals can be conducted from different regions on the chip.

Figure 5A:
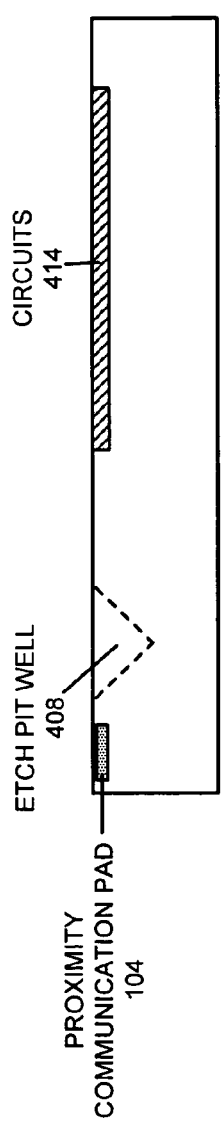
FIG. 5A illustrates an integrated circuit chip where the etch pit processing occurred after fabricating the circuits in accordance with an embodiment of the present invention.
Figure 5B:
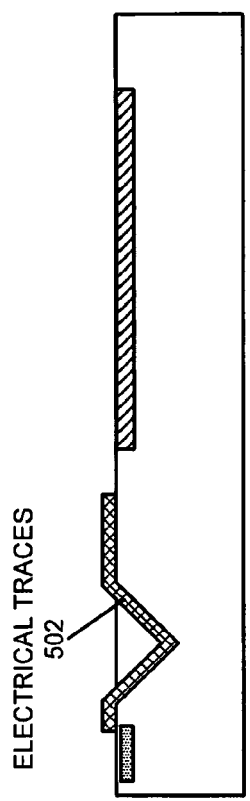
FIG. 5B illustrates electrical traces inside the etch pit that establish conductive connections with other regions of the chip in accordance with an embodiment of the present invention.
Figure 5C:
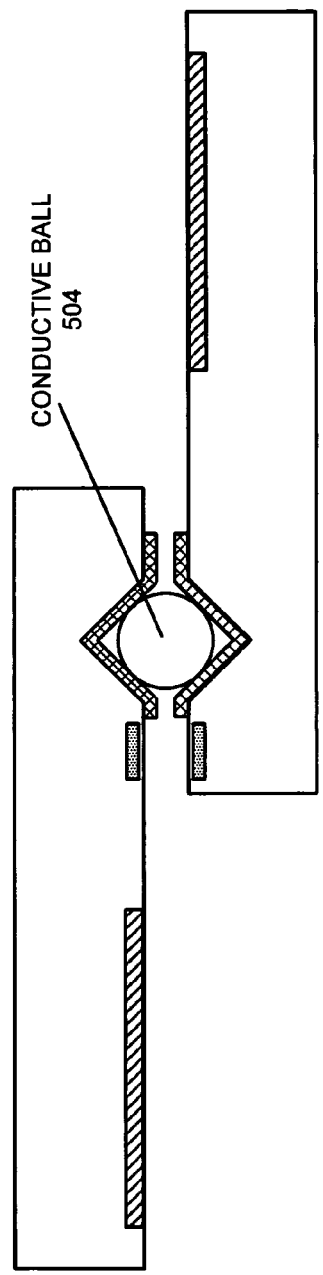
FIG. 5C illustrates two integrated circuit chips containing electrical circuits positioned face-to-face and conductively connected by a shaped structure in accordance with an embodiment of the present invention.

FIGS. 5A-5C illustrate the metallization of the etch pit wells. The etch pits can be made at the wafer scale, either before or after the circuits have been fabricated. FIG. 5A illustrates an integrated circuit chip where the etch pit were made after fabricating the circuits 414. FIG. 5B illustrates electrical traces inside the etch pit that establish conductive connections with other regions of the chip. For instance, the electrical traces might be created as an additional metal layer that connects to a region of a lower metal layer deliberately exposed to allow a conductive connection. Redundancy can be used both for fault tolerance as well as to increase the amount of current for a signal. For instance, an etch pit well might be conductively connected to a metal layer in two places using two sets of electrical traces, to ensure the signal is transferred successfully. Alternatively, multiple conductive shapes and etch pit well pairs may be coupled to a single electrical trace to increase the maximum current for a power or ground signal.

FIG. 5C illustrates two integrated circuit chips containing electrical circuits positioned face-to-face and conductively coupled by a shaped structure, in this example a conductive ball 504. The etch pit wells capture the conductive ball, which both provides a continuous path for a power or ground signal while also holding the two integrated circuit chips in precise mechanical alignment.

Note that many shaped structures of different size and type (with, correspondingly shaped and sized etch pits) may be used to conduct a set of power and ground signals, while a smaller set of shaped structures may be needed to achieve alignment alone. A large number of shaped structures might be used to uniformly distribute and share power and ground between the chips. Shapes can include, but are not limited to, substantially spherical balls, truncated spheres, prisms, hexagons, and pyramids. Different shapes provide different advantages. For instance, a spherical ball may easily roll into an etch pit well despite being initially out of alignment, while if the point of a pyramid is positioned anywhere in the etch pit during the initial coarse alignment, it will easily slide into and align with the etch pit well. Note also that using different shapes optimized either for alignment or conduction allows the fabrication tolerances for the position and orientation of the etch pits to be relaxed while still maintaining overall location and spacing requirements.

In one embodiment of the present invention, the shaped structures can also vary in surface roughness and compliance. For surface roughness, a very fine surface provides the ultimate precision, but micro-roughness may allow better electrical contact. Such roughness is particularly advantageous when simultaneously used with compliant materials within the shaped structure or the etch pit wells (e.g. gold), or when conductive materials such as a low-viscosity paste or liquid are used within the wells to improve the surface contact area. Building compliance into the shaped structure and etch pits also facilitates better surface contact, and can be particularly beneficial to conduct power and ground between the chips. Compressive forces can be used to create compliance within the shaped structures or conductive elastic materials deposited within the wells, thereby increasing the contact surface area and reducing the resistance of the contacts.

Additional Variations

In one embodiment of the present invention, the conductive shaped structure is bonded in-place to the etch pit well of one of the integrated circuit chips using conductive solder or epoxy, thereby creating a permanent low-resistance connection to the chip. This technique creates a remateable male-female connector interface of the type found in many connector topologies. Compliance in the shaped structure can then be advantageously used on the female side to improve the connection and reduce the resistance of the connection.

As mentioned previously, in additional embodiments of the present invention the top and bottom chips may overlap only partially, for instance at the chip corners or along one or more sides of a chip, but still align with each other using the described techniques.

In one embodiment of the present invention, tension is supplied during the passive alignment step and system operation by a compliant, suspension connector system that eliminates chip separation. The connector system provides sufficient compressive force on the chip to maintain the shaped structures within the pits, thereby keeping the chips in alignment, while also providing sufficient compressive force to reduce the resistance of the conductive path between the chips. This connector system is designed to provide some freedom of motion to allow the connector chip to accurately mate with the fixed chip. Note that the compressive force is sufficient to allow the final resting orientation to be determined solely by the orientation of the precision balls or spheres, while also assuring that the chips maintain proper spacing once mated and that the resistance of the connection remains within acceptable ranges. The connector system also provides some protection for the chips in the event there is, some gross misalignment during the mating of the two chips, so that there is some "give" that prevents an interference fit and resulting damage to both chips. Since the precision alignment and power connection are housing independent, low-cost injection-molded parts can be used for the connector system.

In summary, the techniques in the present invention describe a remateable connector that provides precision alignment between semiconductor chips while also transferring power and ground. Etched features in the semiconductor chips and precision conductive elements simultaneously provide alignment and conduct power and ground signals between the chips.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. An apparatus that facilitates precise inter-chip alignment for proximity communication and power delivery, comprising:

a first integrated circuit chip, whose surface has etch pit wells, where an etch pit well is an indented region in the surface of an integrated circuit chip;

a second integrated circuit chip, whose surface has corresponding etch pit wells configured to align with the etch pit wells of the first integrated circuit chip; and a shaped structure which is placed in an etch pit well of the first integrated circuit chip such that when a corresponding etch pit well of the second integrated circuit chip is substantially aligned with the etch pit well of the first integrated circuit chip, the shaped structure mates with both the etch pit well of the first integrated circuit chip and the corresponding etch pit well of the second integrated circuit chip, thereby precisely aligning proximity communication structures in the first integrated circuit chip with corresponding proximity communication structures in the second integrated circuit chip;

wherein the shaped structure creates a conductive connection between the first integrated circuit chip and the second integrated circuit chip and wherein multiple distinct conductive elements with different locations in the etch pit well are used to create the conductive connection.

2. The apparatus of claim 1, wherein the etch pit well includes conductive material that conducts signals to and from other regions of the integrated circuit chip; and wherein a signal conducted between the first integrated circuit chip and the second integrated circuit chip through the shaped structure includes a power signal or a ground signal.

3. The apparatus of claim 2, wherein the shaped structure can be formed in a variety of different shapes that include:

a substantially spherical ball;
a truncated sphere;
a prism;
a hexagon; and/or
a pyramid.

4. The apparatus of claim 3, wherein the apparatus includes multiple shaped structures with different sizes; and wherein the multiple shaped structures can conduct different signals or a smaller set of signals with fault tolerance and/or higher current capacity.

5. The apparatus of claim 2, wherein a conductive material that reduces contact resistance is placed inside the etch pit well to increase surface contact area and reduce electrical resistance; and wherein the conductive material includes a conductive low-viscosity paste or liquid.

6. The apparatus of claim 1, wherein the shaped structure is comprised of:

a conductive material; or
a non-conductive material with a conductive coating.

7. The apparatus of claim 1, wherein compressive forces align the first integrated circuit chip, the shaped structure, and the second integrated circuit chip; and wherein compliance in the shaped structure and/or the etch pit wells facilitates surface contact between the shaped structure and the sidewalls or bottom of the etch pit wells.

8. The apparatus of claim 1, wherein the shaped structure is bonded to the first integrated circuit to create a male-female connector interface.

9. The apparatus of claim 1, wherein the shaped structure provides a connection that can be disconnected and reconnected easily.

10. The apparatus of claim 1, wherein the etch pit well and the shaped structure are formed using:

an additive process;
a subtractive process; or
both an additive and subtractive process.

11. A computer system that facilitates precise inter-chip alignment for proximity communication and power delivery, comprising:

a first integrated circuit chip, whose surface has etch pit wells, where an etch pit well is an indented region in the surface of an integrated circuit chip;

a second integrated circuit chip, whose surface has corresponding etch pit wells configured to align with the etch pit wells of the first integrated circuit chip; and a shaped structure which is placed in an etch pit well of the first integrated circuit chip such that when a corresponding etch pit well of the second integrated circuit chip is substantially aligned with the etch pit well of the first integrated circuit chip, the shaped structure mates with both the etch pit well of the first integrated circuit chip and the corresponding etch pit well of the second integrated circuit chip, thereby precisely aligning proximity communication structures in the first integrated circuit chip with proximity communication structures in the second integrated circuit chip;

wherein the shaped structure creates a conductive connection between the first integrated circuit chip and the second integrated circuit chip and wherein multiple distinct conductive elements with different locations in the etch pit well are used to create the conductive connection.

12. The apparatus of claim 1, wherein when the first integrated circuit chip and the second integrated circuit chip are mated together using the shaped structure:

a first portion of the shaped structure mated to the etch pit well of the first integrated circuit chip extends below the top surface of the first integrated circuit chip; and a second portion of the shaped structure mated to the corresponding etch pit well of the second integrated circuit chip extends below the top surface of the second integrated circuit chip.

13. The apparatus of claim 1, wherein the shape of the etch pit well, the corresponding etch pit well, and the shaped structure are shaped to facilitate changing the alignment of the first integrated circuit chip and the second integrated circuit chip from an initial coarse alignment to a fine alignment that facilitates proximity communication.

* * * * *

UNITED STATES PATENT AND TRADEMARK OFFICE
CERTIFICATE OF CORRECTION

PATENT NO. : 7,592,707 B2  Page 1 of 1
APPLICATION NO. : 11/385445
DATED : September 22, 2009
INVENTOR(S) : Krishnamoorthy et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 354 days.

Signed and Sealed this

Fourteenth Day of December, 2010

David J. Kappos
*Director of the United States Patent and Trademark Office*